United States Patent
Baek et al.

(10) Patent No.: US 6,410,347 B1
(45) Date of Patent: *Jun. 25, 2002

(54) REAL TIME EPITAXIAL GROWTH OF VERTICAL CAVITY SURFACE-EMITTING LASER USING A REFLECTOMETRY

(75) Inventors: Jong Hyeob Baek; Bun Lee, both of Taejon (KR)

(73) Assignee: Electronics and Telecommunications Research Institute, Taejon (KR)

(*) Notice: Subject to any disclaimer, the term of this patent is extended or adjusted under 35 U.S.C. 154(b) by 0 days.

This patent is subject to a terminal disclaimer.

(21) Appl. No.: 09/395,032

(22) Filed: Sep. 13, 1999

(30) Foreign Application Priority Data

Nov. 19, 1998  (KR) ............................................. 98-49840

(51) Int. Cl.[7] .............................................. H01L 21/20
(52) U.S. Cl. ................................ 438/7; 438/14; 438/22
(58) Field of Search .............................. 438/14, 16, 17, 438/22, 24, 7, 478, 479

(56) References Cited

U.S. PATENT DOCUMENTS

| | | | |
|---|---|---|---|
| 5,298,454 A | * 3/1994 | D Asro et al. | |
| 5,386,121 A | 1/1995 | Barbee et al. | |
| 5,397,739 A | * 3/1995 | Cahlmers | |
| 5,472,505 A | * 12/1995 | Lee et al. | 118/715 |
| 5,552,327 A | 9/1996 | Bachmann et al. | |
| 5,731,697 A | 3/1998 | Li et al. | |
| 5,773,316 A | * 6/1998 | Kurosaki et al. | 438/16 |
| 5,856,206 A | * 1/1999 | Beak et al. | 438/32 |
| 6,048,742 A | * 4/2000 | Weyburne et al. | 438/7 |
| 6,160,826 A | * 12/2000 | Swanson et al. | 372/20 |

OTHER PUBLICATIONS

Vertical–Cavity Surface Emitting Lasers: Moving from Research to Manufacturing:, Proceedings of the IEEE, vol. 85, No. 11, Kent D. Choquette, et al., 10 pp.

Complex refractive indices of AIGaAs at high temperatures measured by in situ reflectometry during growth by metalorganic chemical vapor deposition, 1986 American Institute of Physics, J. Appl. Phys. 6 (1) Jan. 1987, pp. 328–332.

In situ Laser Reflectometry Applied To The Growth Of $Al_xGa_{1-x}As$ Bragg Reflectors By Metalorganic Chemical Vapour Deposition, Electronics Letter, 17th Jan. 1991, vol. 27, No. 2.

* cited by examiner

*Primary Examiner*—Savitri Mulpuri
(74) *Attorney, Agent, or Firm*—Cohen, Pontani, Lieberman & Pavane

(57) ABSTRACT

The method of manufacturing VCSEL composed of multiple material layers uses a main measuring laser having same wavelength of that of VCSEL so as to estimate the growth periods required for growing a predetermined thickness of the material layers by analyzing the reflected signal of the main measuring laser and then control the growth time durations of subsequent material layers. This method eliminates the need of pre-knowledge of refractive indexes and the growing speeds of the material layers. Also, an interruptive process for measuring thickness, growth speed or refractive indexes can be omitted so as to perform the entire epitaxial growth in-situ and thus improve the reproducibility and the uniformity. In addition, a subsidiary measuring laser may be used other than the main measuring laser for improving the accuracy of the control of growth time duration, where the subsidiary measuring laser has a different wavelength from that of VCSEL. The subsidiary measuring laser may be used especially in the case of fabricating the VCSEL without any buffer layer.

9 Claims, 5 Drawing Sheets

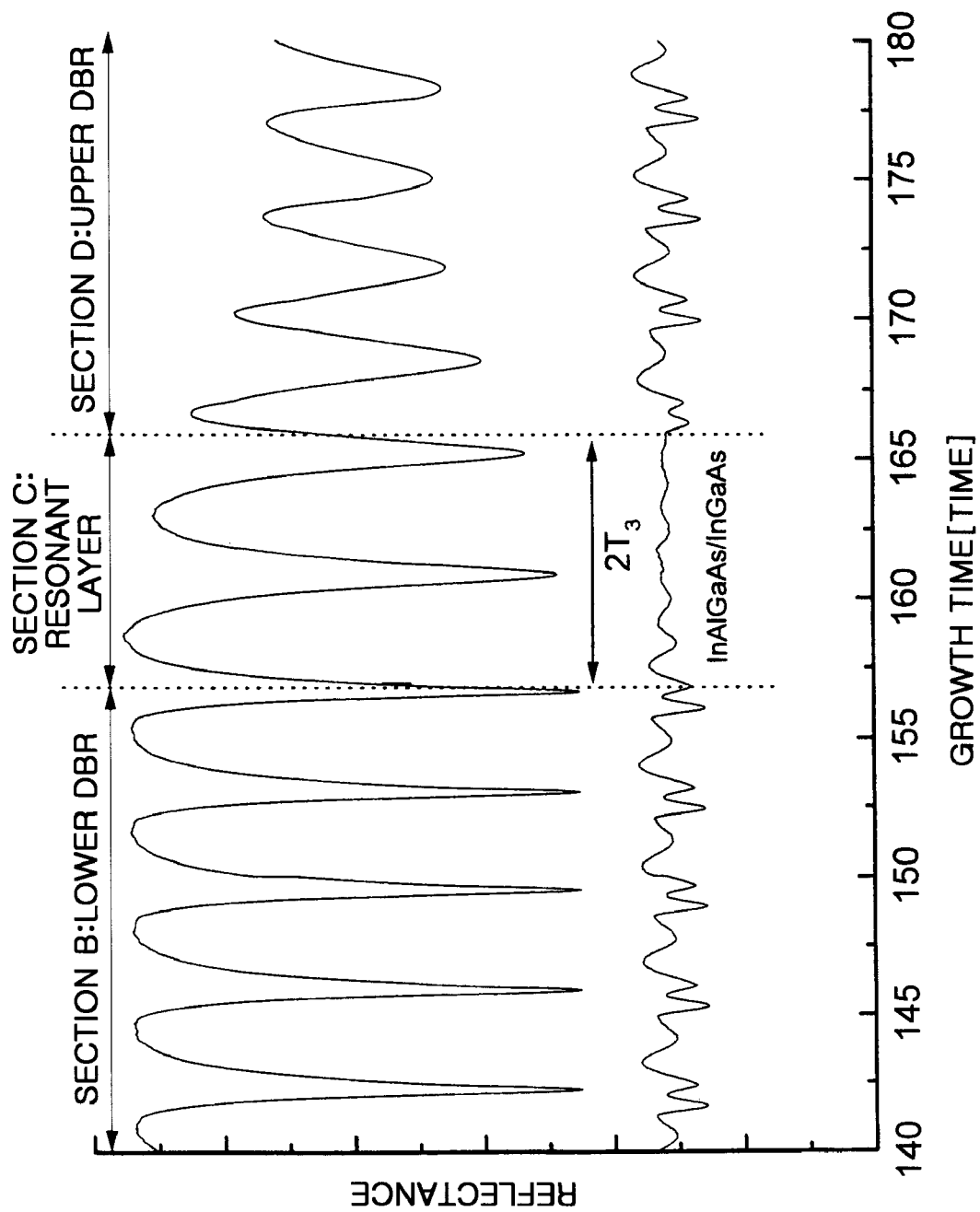

REAL TIME EPITAXIAL GROWTH OF VERTICAL CAVITY SURFACE-EMITTING LASER USING A REFLECTOMETRY

BACKGROUND OF THE INVENTION

The present invention relates to a semiconductor technology, more particularly to an epitaxial growth system for a surface emitting laser using a real time laser reflectometry apparatus and a method for manufacturing a surface emitting laser using it.

The growth of electron and photon structure related epitaxial layer over GaAs or InP substrates using MOCVD method, which is a method for growing semiconductor hetero-thin-film, has been widely studied up to now, and it is also prospected to be studied from now on in order to develop a more improved element.

VCSEL(Vertical-Cavity Surface Emitting Laser) is a semiconductor laser developed in the latter part of 1980's, which is manufactured based on a new concept.

Other conventional lasers are a edge-emitting laser, in which the laser beam is emitted from the cross section of semiconductor substrate. In contrast, VCSEL is a surface emitting laser, in which the laser beam is emitted from the surface of semiconductor substrate. The VCSEL has many advantages for example, low threshold current, high integration capability and high power in array type, so that it is spotlighted as the next-generation light source. The quality of such VCSEL device depends on the uniformity of thickness of DBR (Distributed Bragg Reflector) which is the basic structure therefor. The entire thickness of VCSEL structure is much higher than that of the conventional edge-emitting laser due to the characteristics of the DBR (Distributed Bragg Reflector) structure, so that the growth thereof may be in trouble. For example, the long-time growth required for VCSEL may cause some problems in uniformity and reproducibility of the thickness of epitaxially grown layers, which are the most challenging problems being studied for the VCSEL structure.

According to one conventional method for growing VCSEL structure, multiple material layers used for composing a DBR epi-layer and a cavity epi-layer are formed separately by epitaxial growing method and then the thickness of the material layers are measured by an electron microscope so as to estimate the epitaxially growing speed of respective layers. Upon the estimated growing speed, the time durations required for forming the desired thickness of the material layers within the DBR and the cavity layers are determined. This method has a problem in that the weak reproducibility of the growing equipment may make it impossible to obtain a designed uniform epi-layers since the conditions of growth equipment are not typically maintained uniform for a long time.

In accordance with another conventional technology, the reproducibility of the growing thickness have been more or less improved by a real time laser reflectometry. In other words, the development of a real time laser reflectometry make it possible to know the growing speeds of epi-layers in-situ fabrication even though the unstableness of the environment within the growing equipment is more or less weak. Specifically, the growing time duration of a DBR layer can be controlled in real time so as to obtain the desired thickness of DBR layer as it has been designed. However, in order to use this method the index of refraction of the layer being grown should be known in advance. This is because the index of refraction of epi-layer is required for calculating a growing speed in real time. Thus, there is a problem in that an additive and interruptive step for measuring a index of refraction of the material used in epitaxial growing, must be undesirably required for measuring a growing speed, if the index of refraction of the material is not known in advance.

SUMMARY OF THE INVENTION

Accordingly, the object of the present invention is to provide an epitaxial growing system of surface emitting laser and a method for manufacturing it, in which the reproducibility of the epi-layers in thickness can be achieved without any information on the index of refraction and/or the growing speed of epitaxial material layers in advance.

To achieve the above object, the present invention uses a measuring laser beam in laser reflectometry, the wavelength of which is substantially the same with the wavelength of VCSEL and a reflected wavelength of DBR, for eliminating the need of knowledge of index of refraction and growing speed in advance. If the same wavelength is selected, the middle step required for physical property analysis can be omitted. Also, two laser, one is main and the other is subsidiary, may be used for improving precision, in order to eliminate the need of epitaxially growing the buffer layer. The laser reflectometry can calculate the growing speed of epitaxial layer in situ-fabrication by using a pre-calculated period of a reflected signal from the buffer, if the apparatus is given in advance with the index of refraction of the epitaxial layer. The DBR structure is a designed structure so that the reflectance thereof in a special wavelength is nearly set to 1. The VCSEL structure includes a cavity layer between such lower and upper DBR structures.

The present invention is devised based on that the wavelength of the laser used for measurement are selected to be the same with those of DBR and VCSEL so as to perform a real time epitaxial growth without the need of pre-knowledge of the index of refraction thereof. The two lasers having different wavelengths are used so as to perform a real time epitaxial growth of an unknown refractive index material of DBR without any buffer layer grown.

To achieve the object of the present invention, there is provided an epitaxial growing system for a surface emitting laser including a plurality of material layers, with a reactor for epitaxial growth, comprising: a measuring laser for applying a laser beam having the same wavelength with that of the surface emitting laser to a semiconductor structure being grown in the reactor, the semiconductor structure being fabricated to be the surface emitting laser; a detector for detecting a reflected signal of the measuring laser beam applied to the semiconductor structure; means for estimating at least one period each of which is the time duration required for growing a specific thickness of one of the material layers by performing an analysis of the reflected signal from the detector; and means for controlling growth time durations of respective material layer based on the result of the means for estimating.

In one preferred embodiment, the epitaxial growing system further includes an analog to digital converter for receiving an output of the detector and the measuring laser is substantially composed of a diode laser having a wavelength of 1.5 $\mu$m. Also, the detector may be a Ge detector.

According to another preferred embodiment, there is provided an epitaxial growing system for a surface emitting laser including a plurality of material layers, with an reactor for epitaxial growth, comprising: a main measuring laser for applying a first laser beam to a semiconductor structure in the reactor for measuring a reflectance of the semiconductor structure, wherein the semiconductor structure is fabricated to be the surface emitting laser, and a wavelength of the first laser beam is substantially the same with a wavelength of the surface emitting laser; a subsidiary measuring laser for simultaneously applying a second laser beam with the first laser beam to the semiconductor structure; a first detector for detecting a reflected signal of the main measuring laser; a second detector for detecting a reflected signal of the second laser beam; means for estimating at least one period each of which is the time duration required for growing a specific thickness of one of the material layers by performing an analysis of the reflected signal of the main measuring laser from the first detector and the reflected signal of the subsidiary measuring laser from the second detector; and means for controlling growth time durations of respective material layer based on the result of the means for estimating.

In a specific embodiment, the main measuring laser is substantially composed of a diode laser having a wavelength of 1.5 μm and the subsidiary measuring laser is a He-Ne laser having a wavelength of substantially 0.633 μm. Also, the first detector is a Ge detector and the second detector is a Si detector.

In accordance with another aspect of the present invention, there is provided a method for manufacturing a surface emitting laser, comprising the steps of: applying a main measuring laser beam to a semiconductor structure using a main measuring laser, wherein the semiconductor structure is fabricated to be the surface emitting laser and a wavelength of the main measuring laser is substantially the same with a wavelength of the surface emitting laser; detecting a reflected signal of the main measuring laser beam; estimating at least one period required for growing a specific thickness of a material layer by performing an analysis of the reflected signal; and controlling growth time durations of material layers being subsequently grown, based on the result of the step of estimating.

In one preferred embodiment of the present invention, the surface emitting laser comprising the lower Bragg reflective layer, the cavity layer and the upper Bragg reflective layer. In addition, the surface emitting laser may further comprise a buffer layer under the lower Bragg reflective layer. Specifically, the buffer layer is composed of InAlGaAs/InAlAs layer; each of the upper and the lower Bragg reflective layers is composed of a plurality of InAlGaAs/InAlAs layers; the cavity layer is composed of InAlGaAs/InAlAs layer; when the wavelength of the surface emitting laser is λ, the thicknesses of respective InAlGaAs layer and respective InAlAs layer included in the upper and the lower Bragg reflective layers are $\lambda/4$ and the thicknesses of the InAlGaAs layer and the InAlAs layer within the cavity layer are $\lambda/2$.

It is preferable that the laser beam of the main measuring laser is applied with an incident angle so that the following equation is satisfied, in order that an effective indexes of refraction at a growth temperature are substantially the same with those at a room temperature, $$N^2=n^2-(\sin\theta)^2$$

wherein 'N' represents the effective indexes of refraction at the growth temperature, 'n' represents a low temperature index of refraction and 'θ' represents the incident angle of the laser beam.

In another preferred embodiment, the method further comprises the steps of: simultaneously applying a subsidiary measuring laser beam to the semiconductor structure with the main measuring laser beam by using a subsidiary measuring laser having different wavelength from that of the main measuring laser; detecting a reflected signal of the subsidiary measuring laser beam; and analyzing the reflected signal of the subsidiary measuring laser beam, wherein the steps of estimating the period and controlling the growth time durations are performed with reference to the result of the reflected signal of the subsidiary measuring laser beam. Here, the main measuring laser may have substantially 1.5 μm of wavelength and the subsidiary measuring laser may have substantially 0.633 μm of wavelength.

According to another embodiment, there is provided a method for manufacturing a surface emitting laser having a first wavelength and including a plurality of epitaxial growing layers, comprising the steps of: growing a buffer layer composed of a first material layer and a second material layer, while measuring a reflectance of a semiconductor structure being grown using a measuring laser having a second wavelength same with the first wavelength, the semiconductor structure including the buffer layer and being to become the surface emitting laser; producing a first period and a second period by performing an analysis for the measured reflectance during the buffer layer being grown, wherein the first period is a time duration required for growing a predetermined thickness of the first material layer and the second period is a time duration required for growing a predetermined thickness of the second material layer; and controlling a growing time for the plurality of epitaxial layers, based on the first period and the second period.

According to still another preferred embodiment of the present invention, there is provided a method for manufacturing a surface emitting laser having a first wavelength and including a plurality of epitaxial layers, each of which includes at least one of a plurality of first material layers and a plurality of second material layers, comprising the steps of: growing one of the first material layer, while continuously measuring reflectances thereof by simultaneously using a main measuring laser and a subsidiary measuring laser, wherein the main measuring laser has a second wavelength same with the first wavelength and the a subsidiary measuring laser has a third wavelength different from the first wavelength; stopping the growth of the first material layer and estimating a first period and a maximum point subsidiary reflectance, when the reflectance of the main measuring laser is firstly maximized, wherein the first period is the time duration required for growing a predetermined thickness of the first material layer and the maximum point subsidiary reflectance is the reflectance of the a subsidiary measuring laser when the reflectance of the main measuring laser is firstly maximized; subsequently growing one of the second material layer, while continuously measuring reflectances thereof by simultaneously using a main measuring laser and a subsidiary measuring laser; stopping the growth of the second material layer and estimating a second period and a minimum point subsidiary reflectance, when the reflectance of the main measuring laser is firstly minimized, wherein the second period is the time duration required for growing a predetermined thickness of the second material layer and the minimum point subsidiary reflectance is the reflectance of the a subsidiary measuring laser when the reflectance of the main measuring laser is firstly maximized; and controlling growing time durations for the plurality of epitaxial layers, based on the first period, the second period, the maximum point subsidiary reflectance and the minimum point subsidiary reflectance.

BRIEF DESCRIPTION OF THE DRAWINGS

For a more complete understanding of the present invention and the advantage thereof, reference is now made to the following description taken in conjunction with the accompanying drawings in which:

FIG. 5 is a graph for showing in detail the periods C and D.

DETAILED DESCRIPTION OF THE PRESENT INVENTION

The preferred embodiment of the present invention will hereinafter be described in detail with reference to the accompanying drawings.

Figure 1:
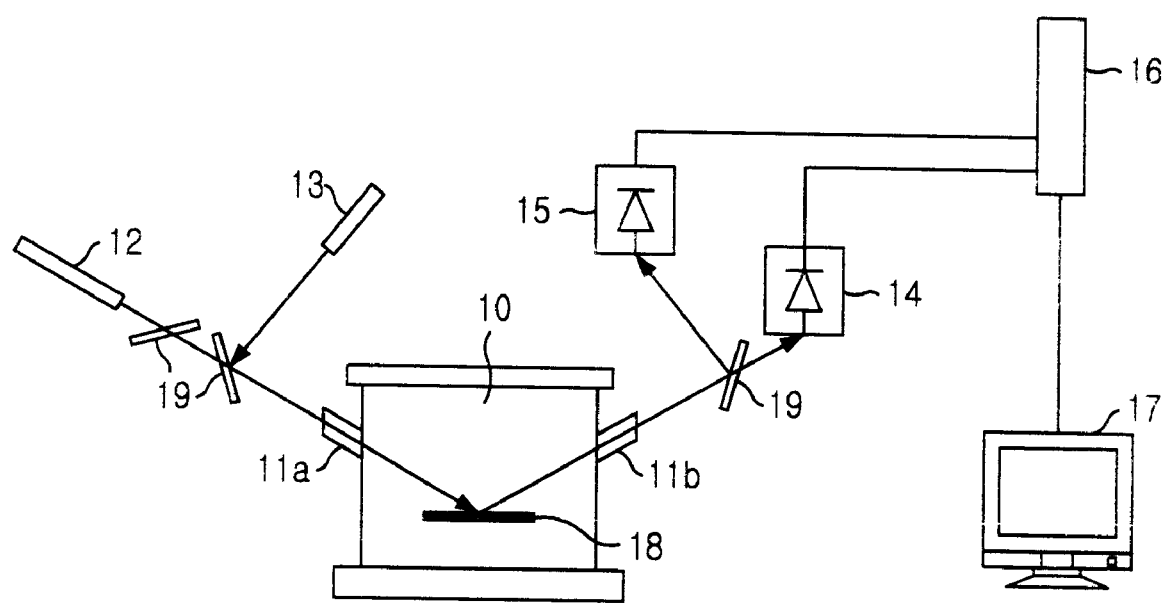
FIG. 1 illustrates the surface emitting laser using a real time laser reflectometry apparatus, in accordance with one preferred embodiment of the present invention.

FIG. 1 is a schematic view for illustrating the configuration of an epitaxially growing system for surface emitting apparatus using a real time reflectometry, in accordance with one preferred embodiment of the present invention.

Referring to FIG. 1, the growing chamber 10 is an internal space where a semiconductor hetero-thin-film is grown. If a source gas is flowed in from the upper part and then reaches a hot substrate in the growing chamber 10, a chemical reaction is made so as to grow a solid state of semiconductor heterothinfilm. This growing method is so called MOCVD (MetalOrganic Chemical Vapor Deposition) in general. The real time reflectometry is attached to the outside of the growing chamber 10 so as to be used for instantaneous analysis of the thickness and the composition of the hetero-thin-film in real time during epitaxial growing process. According to the present invention, a main measuring laser, a subsidiary measuring laser and detectors are further comprised, other than the conventional configured elements. The main measuring laser has the wavelength substantially same with the wavelength of VCSEL to be manufactured, while the subsidiary measuring laser has different wavelength from that of VCSEL to be fabricated. The detectors are used for detecting the reflected signals of the main measuring laser and the subsidiary measuring laser.

The measuring lasers used in this invention are a He-Ne laser and a diode laser, the wavelengths of which are 0.633 $\mu$-and 1.5 $\mu$m, respectively. The laser 13 of 1.5 $\mu$m wavelength is a main measuring laser used for fabricating a 1.5 $\mu$m VCSEL structure that is designed to generate a 1.5 $\mu$m laser beam. The 0.633 $\mu$m laser 12 is used as a subsidiary laser to give an accuracy for controlling the growing thickness using the 1.5 $\mu$m laser 13 without error. That is if a VCSEL having a 'WX' wavelength is to be manufactured, one laser having a 'WX' wavelength can be used as a main measuring laser and another laser having 'WY(≠WX)' wavelength can be used as a subsidiary measuring laser.

The laser beams simultaneously applied into the growing chamber 10 from the 0.633 $\mu$m laser 12 and the 1.5 $\mu$m laser 13 located outside reach the semiconductor structure 18 via a glass window 18a of the growing chamber and then are reflected by the semiconductor structure 18 so as to be transferred to a Si detector 14 and a Ge detector 15, in which the reflected signals are converted into electrical signals so as to be transferred to a computer. Here, the detected signals by the Si detector 14 and the Ge detector 15 are analog-to-digital converted to be transferred to the computer. For doing this, an A/D converter(analog-to-digital converter) 16 is required. Also, the reference numeral '19' represents a reflecting plate for guiding the laser beam.

Figure 2:
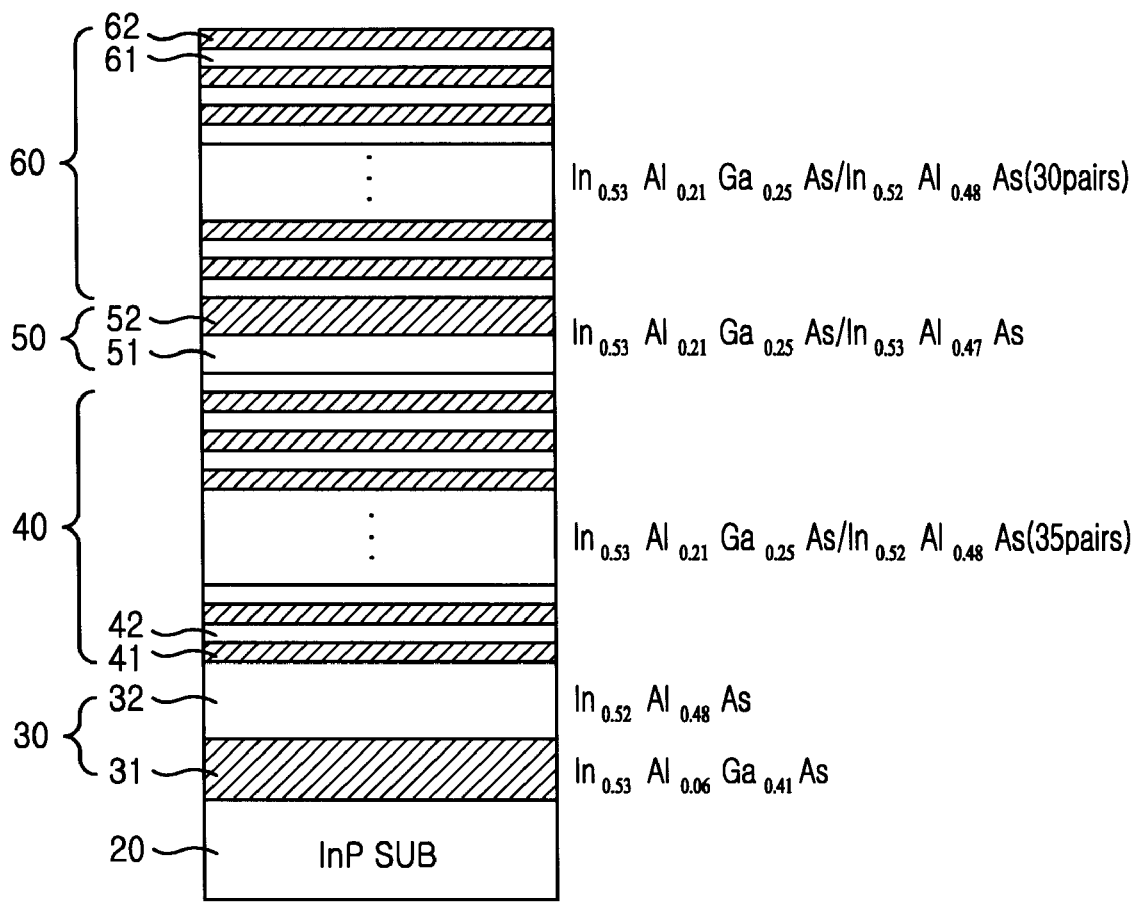
FIG. 2 is a cross sectional view of 1.5 $\mu$m VCSEL.

FIG. 2 shows the cross sectional view of 1.5 $\mu$m VCSEL. The VCSEL structure are designed such that a laser beam is emitted from the top surface or the bottom surface of a substrate. In this embodiment shown in FIG. 2, the VCSEL structure includes a buffer layer 30, a lower DBR layer 40, a cavity layer 50 and an upper DBR layer 60, which are sequentially formed on the InP substrate 20. The buffer layer 30 is composed of an InAlGaAs layer 31 and an InAlAs layer 32 and the lower DBR layer 40 is composed of multiple pairs(e.g. 35 pairs) of InAlGaAs/InAlAs layers 41 and 42. Also, the cavity layer 50 is composed of InAlGaAs/ InAlAs. The upper DBR layer 60 is composed of multiple pairs (e.g. 30 pairs) of InAlAs/InAlGaAs layers 61 and 62, which is symmetrical with the lower DBR layer 40.

In a preferred embodiment of the present invention, the specific composition and the thickness of the layers will be described, referring to FIG. 2. The composition of the InAlGaAs 31 is $In_{0.53}Al_{0.46}Ga_{0.41}As$ and the composition of the InAlAs 32 is $In_{0.52}Al_{0.48}As$ in the buffer layer 30. The material layers 31 and 32 within the buffer layer 30 don't have a substantially critical limitation. The thickness of InAlGaAs 41 and the thickness of InAlAs 42 in the lower DBR layer 40 correspond to $\lambda/4$ ($\lambda$ is the wavelength of the VCSEL being grown), so that the entire thickness of the lower DBR layer 40 reaches to $35*2*\lambda/4=17.5\ \lambda$ (since the lower DBR layer 40 includes 35 pairs of InAlGaAs/InAlAs layers). Also, the compositions of the material layers 41 and 42 in the lower DBR layer 40 are $In_{0.53}Al_{0.21}Ga_{0.25}As$ and $In_{0.52}Al_{0.48}As$, respectively.

The thickness of the cavity layer 50 is the same with the wavelength $\lambda$ of VCSEL laser beam and the compositions of the material layers 51 and 52 included therein are $In_{0.53}Al_{0.21}Ga_{0.25}As$ and $In_{0.52}Al_{0.48}As$, respectively. In other words, the cavity InAlGaAs layer 51 is $\lambda/2$ in thickness and the cavity InAlAs layer 52 is also $\lambda/2$ in thickness.

The respective thickness of the multiple InAlAs layers 61 is $\lambda/4$ and the respective thickness of the multiple InAlGaAs layers 62 is $\lambda/4$, so that the overall thickness of the upper DBR layer 60 is $30*2*\lambda/4=15\ \lambda$ (when the upper DBR layer 60 includes 30 pairs of InAlAs/InAlGaAs layers). The compositions of the material layers 61 and 62 of the upper DBR layer 60 are $In_{0.52}Al_{0.48}As$ and $In_{0.53}Al_{0.21}Ga_{0.25}As$, respectively.

Figure 3:
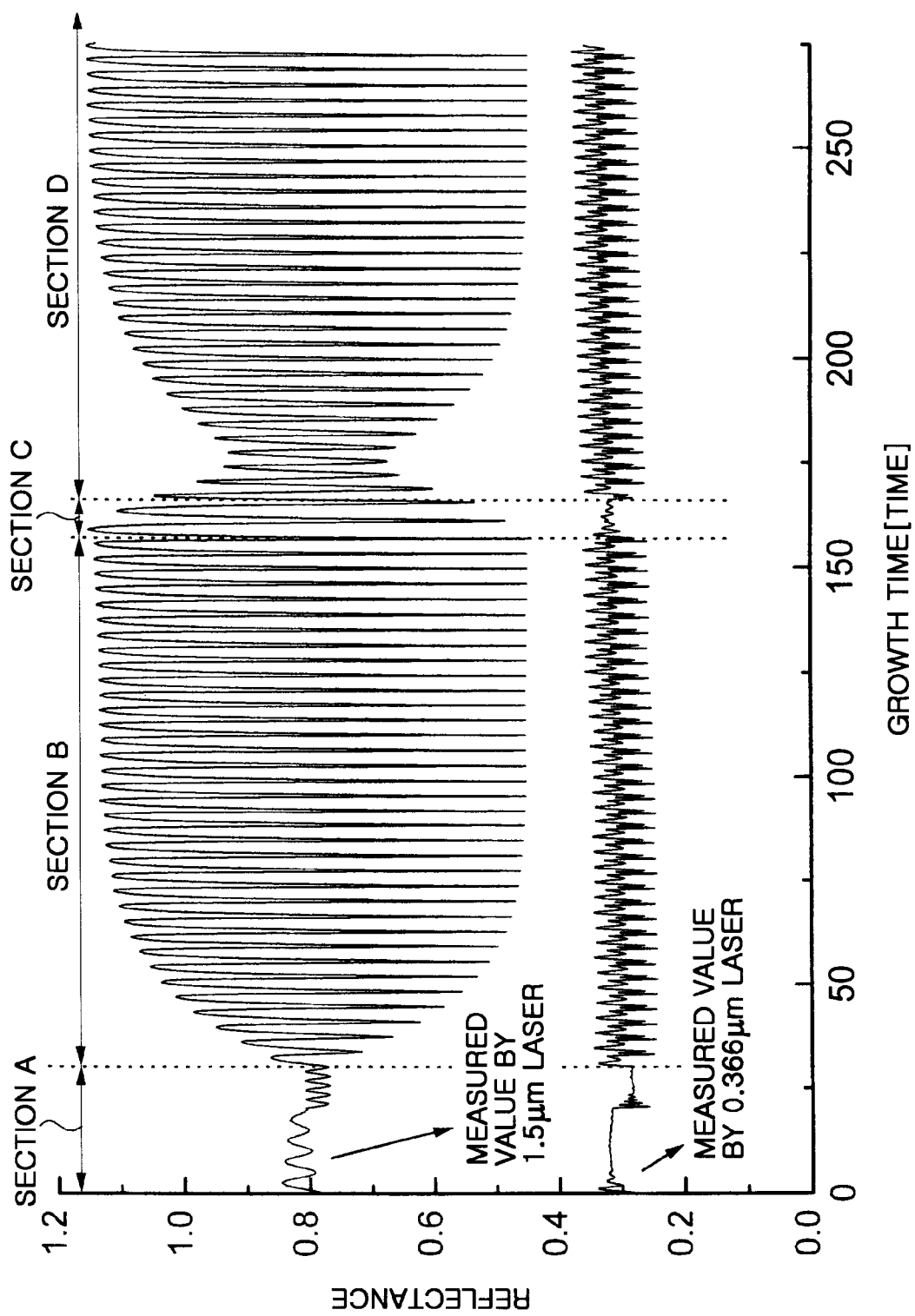
FIG. 3 is a graph for illustrating the reflectances of the reflected signals of 1.5 $\mu$m measuring laser and 0.633 §-measuring laser versus the growth time while the 1.5 $\mu$m VCSEL structure is grown in a growing chamber.

FIG. 3 is a graph for showing the relationship of the reflectances versus the time while forming a 1.5 $\mu$m VCSEL structure in a growing chamber, where the reflectances are simultaneously measured by the reflected signals of a 0.633 §-laser beam and a 1.5 $\mu$m laser beam.

Figure 4:
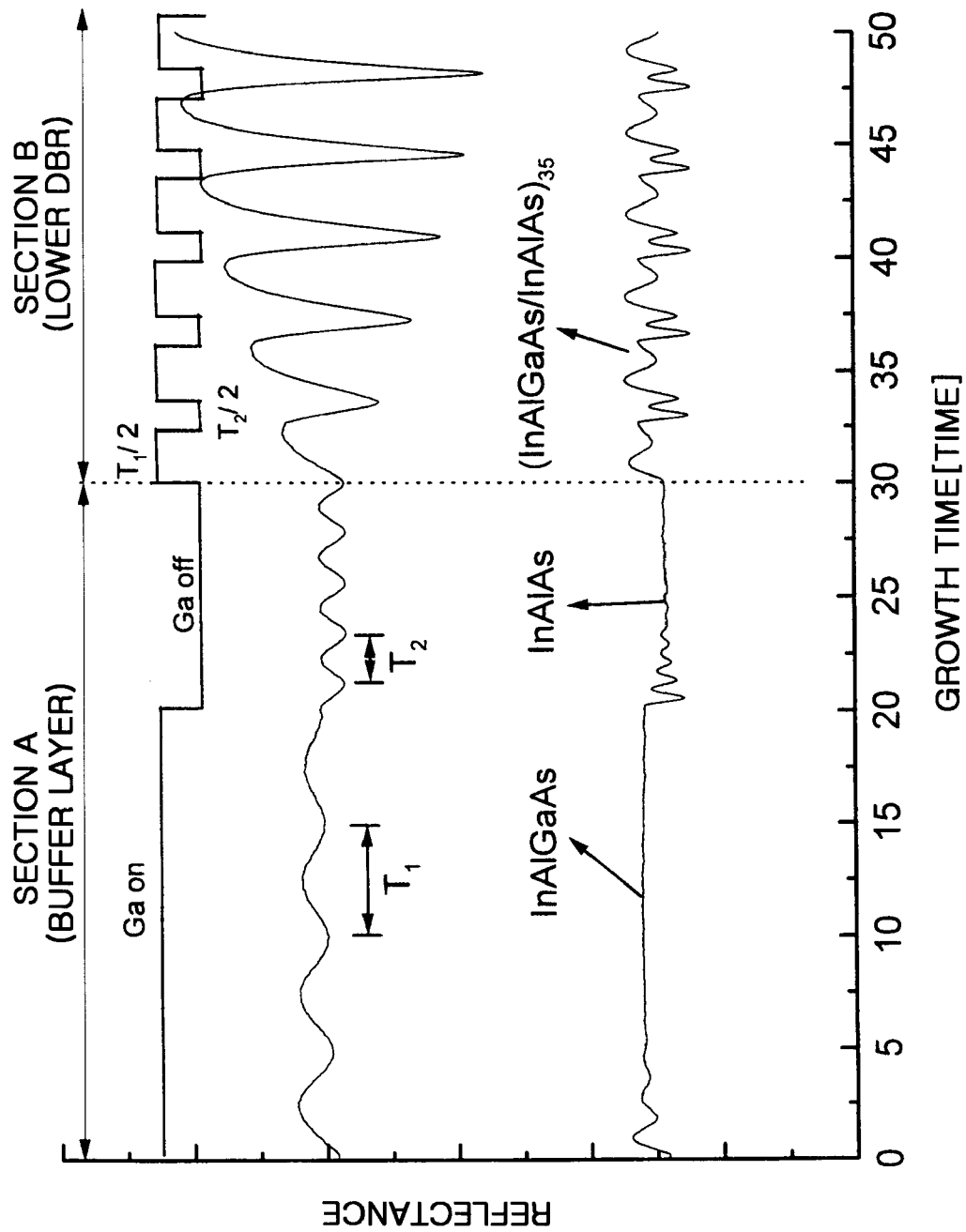
FIG. 4 is a graph for showing in detail the periods A and B shown in FIG. 3.

The growing part of the semiconductor substrate is divided into four section for explanation. The first section A corresponds to the buffer layer that is used for searching a growing condition for VCSEL and the second section B corresponds to the lower DBR layer used as a mirror layer. The third section C corresponds to the cavity layer for generating a laser beam and the fourth section D corresponds to the upper DBR layer played as a role of a mirror layer. FIG. 4 shows the enlarged view of the sections A and B and FIG. 5 shows the enlarged view of the sections C and D.

Hereinafter, for promoting the understanding of the present invention, it will be again explained with reference to the drawings. First of all, the relationship between the epitaxial growth thickness and the periodical characteristics of the reflected signal of the main measuring laser will be explained.

The VCSEL structure shown in FIG. 2 is grown by MOCVD method using the real time laser reflectometry shown in FIG. 1. The reflectances of the main measuring laser and the subsidiary measuring laser are shown in FIG. 3, where the reflectances are continuously measured during epitaxial growth of semiconductor structure. Here, for the convenience of explanation, a hetero-structure including InAlGaAs and InAlAs as epitaxial material layers are selected, since it has suitable lattice parameter and index of refraction so as for reflecting a 1.5 µm laser beam that is widely used for optical communication. However, the wavelength of VCSEL to be manufactured may be different from that of this embodiment and in such a case the main measuring laser should be changed to different wavelength accordingly. For example, if the wavelength of VCSEL is selected to a shorter one than that of this embodiment, GaAs and AlGaAs can be selected as the epitaxial growing materials.

However, since the inventive concept of the present invention is not limited to a specific embodiment, the explanation for 1.5 µm VCSEL laser beam and corresponding hetero structure of this embodiment widely used in optical communication can be also applied to another wavelength VCSEL laser beam and its corresponding structure.

As described above, the buffer layer is formed under the lower DBR layer, composed of the same material with that of the lower DBR layer. This buffer layer is used for estimating a growing speed of this material of the lower DBR layer in advance.

If T1 and T2 represent the periods of the reflected signals of the main measuring laser beam at the epitaxial growth of the InAlGaAs layer 31 and the InAlAs layer 32 included in the buffer layer 30 shown in FIG. 3, respectively and λ represents the wavelength of the main measuring laser, the following equation 1 would be satisfied.

$$T1 = \frac{\lambda}{(2n_1 G_1)} \quad (1)$$

$$T2 = \frac{\lambda}{(2n_2 G_2)}$$

Here, '$n_1$' and '$_2n$' represent the effective indexes of refraction of the buffer material layers 31 and 32, respectively and '$G_1$' and '$G_2$' represent the epitaxial growth speeds of the buffer material layer 31 and 32.

Here, the periodical characteristics of the reflected signal of the main measuring laser beam will be considered, which is revealed as the epitaxial material layers being grown on the semiconductor structure.

When the epitaxial layer is grown, some portion of the main measuring laser beam is reflected by the surface of the semiconductor structure(or the surface of the top epitaxial layer being grown) so as to be feed to the detector and other portion of the main measuring laser beam transmits through the epitaxial layers to the substrate(e.g. InP substrate 20) and then is reflected by the substrate so as to be feed to the detector. Accordingly, there is an interference due to the path difference between the reflected laser beam by the surface of the top epitaxial material layer (hereinafter it is called as 'surface reflected signal') and the reflected laser beam by the surface of the substrate (hereinafter it is called as 'substrate reflected signal'.

Meanwhile, as the epitaxial growth make progress, the entire thickness of the epitaxial layers is increased and thus the path difference between the surface reflected signal and the substrate reflected signal is also increased. Here, when the path difference between the surface reflected signal and the substrate reflected signal of the main measuring laser corresponds to mλ (m is an integer and λ is the wavelength of VCSEL or the main measuring laser)(that is when the phases of the surface reflected signal and substrate reflected signal are coincided with each other), the surface reflected signal and the substrate reflected signal make an enhancement interference so that the strength of the overall reflected signal (or the reflectance) of the main measuring laser beam is maximized. In contrast, when the path difference of the surface reflected signal and the substrate reflected signal corresponds to (m+1)λ (wherein m is an integer)(that is when the phases of the surface reflected signal and the substrate reflected signal are the same with each other), they make a compensation interference so that the strength of the overall reflected signal of the main measuring laser beam is minimized. Here, the path difference is roughly proportional to twice of the distance from the top surface to the substrate and thus the reflected signal reveals the periodical characteristics in that it is maximized whenever the entire thickness of the grown epitaxial layers corresponds to mλ/2 (wherein m is an integer and λ is the wavelength of VCSEL or the main measuring laser). In other words, the time duration between adjacent two maximum points of the reflected signal corresponds to the time duration required for λ/2 thickness of corresponding epitaxial material layer.

Even though the accurate representation of the signal detected by a detector is a real complex function since the reflected signal of the main measuring laser includes another components reflected by the boundaries between epitaxial layers other than the surface reflected signal and substrate reflected signal, such another components are so small that their effect to the resulting reflected signal can be ignored. Thus, the resulting reflected signal of the main measuring laser can be considered as a periodical signal that is maximized whenever the entire thickness from the top surface to the substrate) reaches mλ/2 (m is an integer and λ is the wavelength of VCSEL).

Here, the period T1 of the reflected signal of the main measuring laser, which is measured during the epitaxial growth of the buffer layer shown in FIG. 3, corresponds to λ/2 thickness of InAlGaAs layer 41 included in the lower DBR layer 40. Thus, the growth time required for epitaxial growth of λ/4 thickness of the lower DBR InAlGaAs material layer 41 is T1/2. Here, as described above, λ is the wavelength of the main measuring laser, the wavelength of VCSEL to be manufactured or the reflective wavelength of the lower DBR layer. Thus, if the reflected wavelength of the lower DBR layer varies, the wavelength of the measuring laser beam should vary accordingly.

On the other hand, the period T2 of the reflected signal of the main measuring laser, which is measured during the epitaxial growth of the InAlAs material layer 32 within the buffer layer 30, is the time duration required for growing λ/2 thickness of InAlAs material layer 42 included in the lower DBR layer 40. Therefore, the time duration for epitaxial growth of λ/4 thickness of lower DBR InAlAs material layer 42 is T2/2.

As explained above, it is possible that the growth time durations for the InAlGaAs material layers and the InAlAs material layers included in the cavity layer 50 and the upper DBR layer 60 are controlled based on the T1 and T2.

Meanwhile, since the growing temperature is very high and the growth period T1 of InAlGaAs material and the growth period T2 InAlAs material are estimated on the reflected signal acquired at the high temperature. In contrast, since the VCSEL structure is typically used at room temperature(or the lower DBR reflected wavelength is measured at room temperature, a distortion of refractive index due to the temperature difference may be made. However, the distortion in refractive index can be compensated by giving a suitable incident angle θ to the measuring laser beams applied to the semiconductor structure. Therefore, the refractive index of the buffer layer being grown at high temperature is substantially the same with the refractive index of the lower DBR layer at room temperature, so that the wavelength of lower DBR layer being grown is substantially the same with that of the measuring laser.

This is in detail explained in the following equation 2 that illustrates an optical law of s-polarized beam, wherein 'N' represents a refractive index at room temperature, 'n' represents explains a refractive index at high temperature for epitaxial growth and '$n_{eff}$' represents an effective refractive index at the high temperature, for a certain epitaxial layer.

$$n^2 = (n_{eff})^2 + (\sin \theta)^2 - k^2 \quad (2)$$

Here, 'k' represents the absorption coefficient of the epitaxial layer and is generally very small value so as to be ignored. This equation can be re-written as the following equation (3), in which the effective refractive index $n_{eff}$ at high temperature is disposed in left side and the other terms are disposed in right side.

$$(n_{eff})^2 = (n)^2 - (\sin \theta)^2 \quad (3)$$

Here, $(n_{eff})^2 = N$ (or the effective refractive index at the high growth temperature equals the refractive index at room temperature) to provided that the following equation (4) is satisfied.

$$N^2 = (n)^2 - (\sin \theta)^2 \quad (4)$$

In other words, the main measuring laser beam is applied with an incident angle e to satisfy the above equation (4).

As described above, if the growth of buffer layer 30 is finished, the growth time required for the lower DBR InAlGaAs material layer 41 is set to T1/2 and the growth time for the lower DBR InAlAs material layer 42 is set to T2/2, so that the lower DBR reflective film 40 composed of 35 pairs of InAlGaAs/InAlAs is formed.

Also, after the growth of the lower DBR reflective film 40 is finished, InAlGaAs material layer 51 of the cavity layer 50 is grown during 2T1 and then the InAlAs material layer 52 of the cavity layer 50 is grown during 2T2.

Subsequently, each of the InAlAs material layers 61 and each of the InAlGaAs material layers 62 included in the upper DBR layer 60 are grown during T2/2 and T1/2, respectively.

Meanwhile, as known from the FIG. 3, as the repeated number of the material layers of the DBR reflective film is increased, the overall reflectance is increased accordingly. This is because the DBR reflective film is designed to have the same reflective wavelength with that of the main measuring laser and thus as the repeated number of InAlGaAs/InAlAs of DBR is increased so the reflected signal having the designed wavelength is amplified. Accordingly, it is checked whether the thickness of DBR reflective film accurately corresponds to the designed dimension.

On the other hand, the lower DBR reflective film can be formed directly on the substrate without any buffer layer. In addition, a subsidiary measuring laser is preferably used for increasing the accuracy of the period measurement of the reflected signal.

If the lower DBR reflective film 40 is grown directly on the substrate 10 without any buffer formation, the time from the growing start point of the first InAlGaAs material layer 41 to the first maximum point of the reflective signal of the main measuring laser is measured to be set to T1/2. As explained above, T1/2 is the time required for growing the thickness of λ/4=1.5 μm/4 InAlGaAs material layer. Here, the maximum point of the reflected signal of the main measuring laser can be detected by performing an analysis (e.g. estimating a transition point) of the reflected signal in real time. When the first maximum point is reached, the growth of InAlGaAs material layer 41 is stopped and then the InAlAs material layer 42 is grown. In one preferred embodiment, this change of the grown layers is made by stopping supply of Ga gas. As the InAlAs material layer 42 is grown, the reflected signal of the main measuring laser is decreased so as to reach the first minimum point of the reflected signal. When the first minimum point is reached, the period from the first maximum point to the first minimum point is set to T2/2 that is the time required for growing the thickness of λ/4=1.5 μm/4 InAlAs material layer. Also, the detection of the minimum point can be performed as for the maximum point. Subsequently, the InAlGaAs material layer 41 and the InAlAs material layer 42 are repeatedly grown in 34 times. This repeated growth results in the lower DBR reflective film 40.

Meanwhile, a subsidiary measuring laser having a different wavelength from the wavelength λ of VCSEL in order to improve the accuracy of the control of growing time and the detection of the maximum and the minimum points. In other words, the wavelength of the subsidiary measuring laser is different from the reflected wavelength of the lower DBR reflective film 40 and the wavelength of the main measuring laser. Specifically, as shown in FIG. 3, when 0.633 μm laser is used as the subsidiary measuring laser, the reflected signal of the subsidiary measuring laser would not much change during epitaxial growth. Thus, the reflectance and the period of 0.633 μm subsidiary measuring laser are measured when the reflectance of 1.5 μm main measuring laser is first-maximized and first-minimized. Then, in the subsequent epitaxial growing process, the time point when the reflectance and the period of 0.633 μm subsidiary measuring laser are the same with the measured reflectance and period, respectively, is that the reflectance of 1.5 μm main measuring laser is maximized and minimized, respectively. Also, even though the reflectance of the reflected signal of 1.5 μm main measuring laser during the epitaxial growth of the cavity layer is considerably similar to that during the epitaxial growth of DBR layer so that the starting point may be vague, the usage of the subsidiary measuring laser compensates this defect.

As described above, this invention can eliminate the interruptive measuring process for measuring the material characteristics of the materials being used for growing a VCSEL structure laser. Thus, the present invention has advantages in productivity and economical aspect.

Although preferred embodiments of the present invention has been illustrated and described, various alternatives, modifications and equivalents may be used. Therefore, the foregoing description should not be taken as limiting the scope of the present invention which is defined by the appended claims.

What is claimed is:

1. A method for manufacturing a surface emitting laser, comprising the steps of:

applying a main measuring laser beam to a semiconductor structure using a main measuring laser, wherein the semiconductor structure is fabricated to be the surface emitting laser and a wavelength of the main measuring laser is substantially the same with a wavelength of the surface emitting laser;

detecting a reflected signal of the main measuring laser beam;

estimating at least one period required for growing a specific thickness of a material layer by performing an analysis of the reflected signal; and controlling growth time durations of material layers being subsequently grown, based on the result of the step of estimating.

2. The method of the claim 1, wherein said surface emitting laser comprising the lower Bragg reflective layer, the cavity layer and the upper Bragg reflective layer.

3. The method of the claim 2, wherein said surface emitting laser further comprises a buffer layer under the lower Bragg reflective layer.

4. The method of the claim 3, wherein said buffer layer is composed of InAlGaAs/InAlAs layer;

each of the upper and the lower Bragg reflective layers is composed of a plurality of InAlGaAs/InAlAs layers;

said cavity layer is composed of InAlGaAs/InAlAs layer;

when the wavelength of the surface emitting laser is $\lambda$, the thicknesses of respective InAlGaAs layer and respective InAlAs layer included in the upper and the lower Bragg reflective layers are $\lambda/4$ and the thicknesses of the InAlGaAs layer and the InAlAs layer within the cavity layer are $\lambda/2$.

5. The method of the claim 1, wherein the laser beam of the main measuring laser is applied with an incident angle so that the following equation is satisfied, in order that an effective indexes of refraction at a growth temperature are substantially the same with those at a room temperature, $$N^2 = n^2 - (\sin \theta)^2$$

wherein 'N' represents the effective indexes of refraction at the growth temperature, 'n' represents a low temperature index of refraction and '$\theta$' represents the incident angle of the laser beam.

6. The method of the claim 1, further comprising the steps of:

simultaneously applying a subsidiary measuring laser beam to the semiconductor structure with the main measuring laser beam by using a subsidiary measuring laser having different wavelength from that of the main measuring laser;

detecting a reflected signal of the subsidiary measuring laser beam; and analyzing the reflected signal of the subsidiary measuring laser beam, wherein the steps of estimating the period and controlling the growth time durations are performed with reference to the result of the reflected signal of the subsidiary measuring laser beam.

7. The method of the claim 6, wherein the main measuring laser has substantially 1.5 $\mu$m of wavelength and the subsidiary measuring laser has substantially 0.633 $\mu$m of wavelength.

8. A method for manufacturing a surface emitting laser having a first wavelength and including a plurality of epitaxial growing layers, comprising the steps of:

growing a buffer layer composed of a first material layer and a second material layer, while measuring a reflectance of a semiconductor structure being grown using a measuring laser having a second wavelength same with the first wavelength, said semiconductor structure including the buffer layer and being to become the surface emitting laser;

producing a first period and a second period by performing an analysis for the measured reflectance during the buffer layer being grown, wherein said first period is a time duration required for growing a predetermined thickness of the first material layer and said second period is a time duration required for growing a predetermined thickness of the second material layer; and controlling a growing time for the plurality of epitaxial layers, based on the first period and the second period.

9. A method for manufacturing a surface emitting laser having a first wavelength and including a plurality of epitaxial layers, each of which includes at least one of a plurality of first material layers and a plurality of second material layers, comprising the steps of:

growing one of the first material layer, while continuously measuring reflectance thereof by simultaneously using a main measuring laser and a subsidiary measuring laser, wherein said main measuring laser has a second wavelength same with the first wavelength and said a subsidiary measuring laser has a third wavelength different from the first wavelength;

stopping the growth of the first material layer and estimating a first period and a maximum point subsidiary reflectance, when the reflectance of the main measuring laser is firstly maximized, wherein said first period is the time duration required for growing a predetermined thickness of the first material layer and the maximum point subsidiary reflectance is the reflectance of the a subsidiary measuring laser when the reflectance of the main measuring laser is firstly maximized;

subsequently growing one of the second material layer, while continuously measuring reflectance thereof by simultaneously using a main measuring laser and a subsidiary measuring laser;

stopping the growth of the second material layer and estimating a second period and a minimum point subsidiary reflectance, when the reflectance of the main measuring laser is firstly minimized, wherein said second period is the time duration required for growing a predetermined thickness of the second material layer and the minimum point subsidiary reflectance is the reflectance of the a subsidiary measuring laser when the reflectance of the main measuring laser is firstly maximized; and controlling growing time durations for the plurality of epitaxial layers, based on the first period, the second period, the maximum point subsidiary reflectance and the minimum point subsidiary reflectance.

* * * * *